(12) United States Patent
Barnes et al.

(10) Patent No.: US 7,871,663 B1
(45) Date of Patent: Jan. 18, 2011

(54) MINUTE DOPING FOR YBCO FLUX PINNING

(75) Inventors: Paul N. Barnes, West Milton, OH (US); Joseph W. Kell, Kettering, OH (US); Timothy J. Haugan, Beavercreek, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 1142 days.

(21) Appl. No.: 11/543,286

(22) Filed: Oct. 3, 2006

Related U.S. Application Data

(60) Provisional application No. 60/726,882, filed on Oct. 3, 2005.

(51) Int. Cl.
*B05D 5/12* (2006.01)
*H01L 39/24* (2006.01)
*C23C 14/00* (2006.01)

(52) U.S. Cl. .......... 427/62; 427/586; 427/596; 29/599; 204/192.15; 505/470; 505/741

(58) Field of Classification Search ........ 427/62, 427/586, 596; 204/192.15; 29/599; 505/470, 505/741
See application file for complete search history.

(56) References Cited

U.S. PATENT DOCUMENTS

| | | | |
|---|---|---|---|
| 5,998,338 A | 12/1999 | Watanabe et al. | |
| 6,569,360 B2 | 5/2003 | Wu | |
| 6,569,811 B1 | 5/2003 | Shi | |
| 6,645,313 B2 | 11/2003 | Goyal et al. | |
| 6,830,776 B1 * | 12/2004 | Barnes et al. | 427/63 |
| 2005/0043183 A1 * | 2/2005 | Chan | 505/100 |
| 2005/0159298 A1 * | 7/2005 | Rupich et al. | 502/100 |

OTHER PUBLICATIONS

Kell et al., "Tb and Ce Doped Y123 films processed by Pulsed Laser Ablation", conference, Oct. 2004.*
Paulius et al. "Enhancement of flux pinning by PR doping in YPrBaCuO", Physical Review B, vol. 47, No. 17 pp. 11627-11630. May 1, 1993.*
Fincher Jr. et al. "Ce and Tb substitution for Y in YBaCuO thin films", Physical Review Letters, vol. 67, No. 20, pp. 2902-2905, Nov. 11, 1991.*
Tsurumi et al., *High $T_c$ Superconductivities of $A_2Ba_4Cu_6O_{14+y}$*, Japanese Journal of Applied Physics, pp. 856-857, vol. 26, No. 5, May 1987.

(Continued)

*Primary Examiner*—Brian K Talbot
(74) *Attorney, Agent, or Firm*—AFMCLO/JAZ; James C. Calve

(57) ABSTRACT

A method for enhancing the flux pinning of a YBCO superconductor by substituting minute quantities of rare earth elements (La, Ce, Pr, Nd, Pm, Sm, Eu, Gd, Tb, Dy, Ho, Er, Tm, Yb, Lu) or other deleterious elements (Sc, etc.) for Y in YBCO thin films is described. The method of the present invention enables enhanced flux pinning of the material while not significantly increasing the cost of the HIS material and can be used in all HTS deposition methods since it is not process dependent.

12 Claims, 2 Drawing Sheets

Jc vs. Field for minutely doped samples @ 77K

OTHER PUBLICATIONS

Fincher et al., *Ce and Tb Substitution for Y in $YBa_2Cu_3O_7$ Thin Films*, Physical Review Letters, pp. 2902-2905, vol. 67, No. 20, Nov. 1991.

Staub et al., *Tb Oxidation State and Hybridization in $Y_{0.9}Tb_{0.1}Ba_2Cu_3O_{7-\delta}$ ($\delta=0.02, 0.84$): A Magnetic-susceptibility and X-ray-absorption Study*, Physical Review B, pp. 7085-7091, vol. 50, No. 10, Sep. 1994.

Kell et al., *Tb and Ce Doped $Y_{123}$ Films Processed by Pulsed Laser Deposition*, Applied Superconductivity Conference Presentation, abstract only, Oct. 2004.

Freibert et al., *Anisotropic Magneto-resistivity in Pr and Tb Doped YBCO*, American Physical Society Annual Meeting, abstract only, Mar. 1996.

* cited by examiner

MINUTE DOPING FOR YBCO FLUX PINNING

CROSS REFERENCE TO RELATED APPLICATIONS

The present application is related to and claims priority on prior provisional Application No. 60/726,882, filed Oct. 3, 2005, entitled "Minute RE Doping For YBCO Flux Pinning"

RIGHTS OF THE GOVERNMENT

The invention described herein may be manufactured and used by or for the Government of the United States for all governmental purposes without the payment of any royalty.

BACKGROUND OF THE INVENTION

The present invention relates generally to high temperature superconductors and more specifically to a method of imparting magnetic flux pinning within a high temperature superconductor to improve current transport by introducing minute quantities of dopants.

The desirability of providing efficient high temperature superconductors for operation at 20° K and higher is well known. Indeed, there has been an enormous amount of experimental activity in these so called high temperature superconductors since research in the mid 1980s first demonstrated dramatic gains in raising the maximum critical transition temperatures from the 20° K range to the 90° K range.

In general, superconductors and superconducting material exhibit zero resistance when operating at temperatures below their maximum critical transition temperature. This quality of operating at zero resistance facilitates the construction and operation of highly efficient devices such as superconducting magnets, magnetic levitators, propulsion motors and magnetohydronamics, power generators, particle accelerators, microwave and infrared detectors, etc.

High temperature superconducting (HTS) generators and magnets are significantly lighter and more compact than their conventional counterparts. The development of these devices is essential to military applications requiring compact, lightweight, high power sources or compact high field magnets, especially ground mobile, airborne and naval applications. The high temperature superconducting coated conductor can be used to make the coil windings in HTS generators as well as the HTS magnet windings. As such, long lengths of the YBCO coated conductor with high current transport in a magnetic field are necessary for effective use in these applications.

SUMMARY OF THE INVENTION

The method of the present invention incorporates the substitution or addition of minute quantities of rare earth elements (La, Ce, Pr, Nd, Pm, Sm, Eu, Gd, Tb, Dy, Ho, Er, Tm, Yb, Lu) or other deleterious elements (Sc, etc.) in YBCO thin films to achieve the appropriate defect densities for enhanced flux pinning. Advantageously, the method of the present invention enables enhanced flux pinning of the material while not significantly increasing the cost of the HTS material or processing parameters. The minute doping approach of the present invention can be used in all HTS deposition methods such as MOCVD, MOD, PLD, sol-gel, sputtering and/or electrolytic deposition, etc., since it is not process dependent.

BRIEF DESCRIPTION OF THE DRAWING

The accompanying drawing incorporated in and forming a part of the specification, illustrates several aspects of the present invention and together with the description serves to explain the principles of the invention. In the drawing.

DETAILED DESCRIPTION OF THE INVENTION

Figure 1:
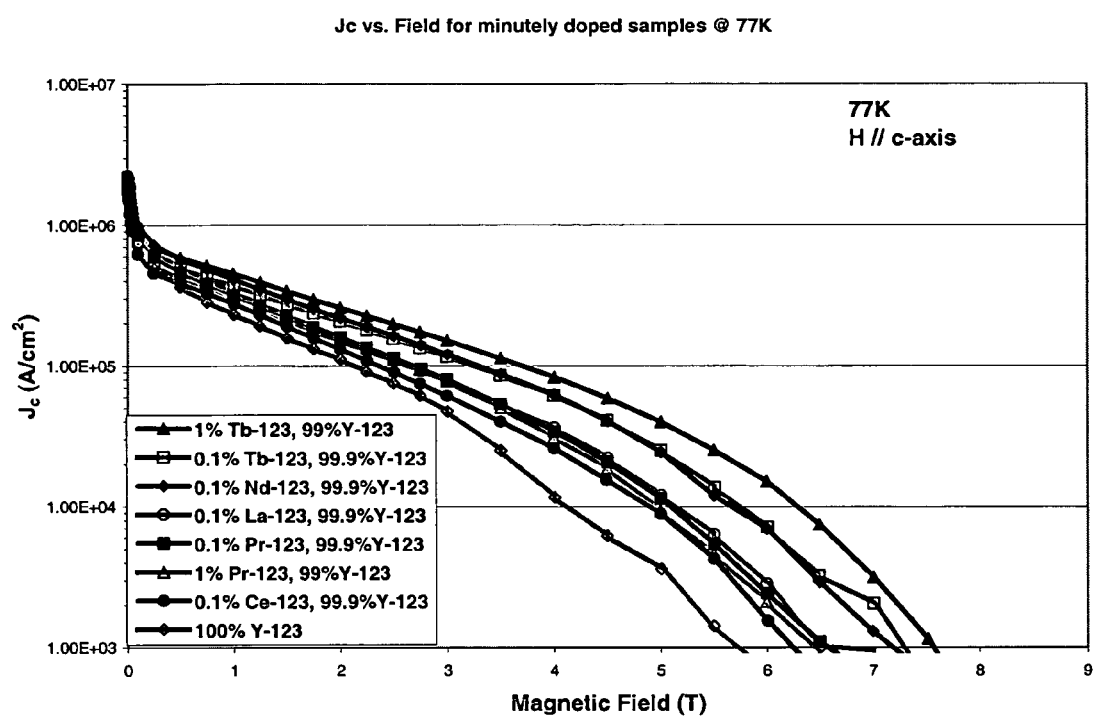
FIG. 1 is a graph illustrating the magnetic $J_c$ values of $Y_{1-x}M_xBa_2Cu_3O_{7-z}$ films, where M stands for deleterious elements (i.e. rare earth elements, Sc, etc.) compared to a reference Y123 film made using the same deposition conditions at 77K and H//c-axis; and, FIG. 2 is a graph illustrating the magnetic $J_c$ values of $Y_{1-x}M_xBa_2Cu_3O_{7-z}$ films compared to a reference Y123 film made using the same deposition conditions at 65K and H//c-axis.

The present invention relates to a method of imparting magnetic flux pinning within a high temperature superconductor to improve current transport by introducing minute quantities of dopants into the material. According to the method of the present invention, substitution of small quantities ($x \leq 0.02$) of rare earth elements (La, Ce, Pr, Nd, Pm, Sm, Eu, Gd, Tb, Dy, Ho, Er, Tm, Yb, Lu) or other deleterious elements (Sc, etc.) for Y in Y123 thin films has been demonstrated to achieve the appropriate defect densities for enhanced flux pinning. As used herein, "deleterious element" is intended to refer to a material that in large quantities would degrade the performance of the superconductor in an undesirable fashion. The method of the present invention enables enhanced flux pinning of the material while not significantly increasing the manufacturing cost of the HTS material. Additionally, the minute doping approach of the present invention can be used in all HTS deposition methods such as Metal-Organic Chemical Vapor Deposition (MOCVD), Metal-Organic Deposition (MOD), Pulsed Laser Deposition (PLD), sol-gel, sputtering and/or electrolytic deposition, etc., since it is not process dependent.

Coated conductor technology for biaxially aligned $YBa_2Cu_3O_{7-z}$ (Y123) on buffered metallic substrates with $J_c > 1$ MA/cm$^2$ offers great promise as a second generation, high temperature superconducting wire for use in generators and motors. Y123 has many useful properties at 77 K such as high critical current densities ($J_c$) and good flux pinning in applied magnetic fields, which is critical in most applications. However, when magnetic fields are applied parallel to the c-axis, $J_c$ will typically decrease by a factor of 10 to 100 within the range of 1 T<$B_{appl}$<5 T. Accordingly, further improvement of $J_c$ is desirable, especially for c-axis orientation of the applied field, to allow further reduction in system weight and size. In most applications, the value $J_c$(H) places an upper limit on the magnetic field that can be produced/applied for a given coil design.

Recently, REBa$_2$Cu$_3$O$_{7-z}$ (RE123) (where RE stands for rare earth elements) superconductors have been considered for use in applications of thin film coated conductors because of their desirable high critical transition temperatures ($T_c$) (~92 K), and high critical current density ($J_c$) at 77 K in applied magnetic fields. According to the method of the present invention, the partial substitution of rare earth elements or other deleterious elements (herein represented as M) in the $(Y_{1-x}M_x)Ba_2Cu_3O_{7-z}$, ($x \leq 0.02$), as dopants, has been demonstrated to enhance flux pinning. As an example, Tb, Ce and Pr are divalent, having both +3 and +4 valance states and can act as pinning sites by localized lattice distortion or other potential mechanism. Even if a rare earth can readily form the proper REBCO superconducting phase, as in the case of Nd and La, they can be poor dopants in YBCO by substituting undesirably into the Ba site, degrading the superconductor's performance. However, in small quantities, these Ba substitutions can also act as a potential pinning mechanism. In addition, using small quantities of dopants allows the same processing conditions to be used for making high quality YBCO.

An example of the method of the present invention using terbium as a dopant follows. Terbium does not degrade the $T_c$ of Y123 and the divalent nature of terbium (+3 and +4 valence states) can allow for $Tb^{4+}$ to act as pinning sites by alternate chemical bonding, localized lattice distortion, or other methods. The crystal ionic radii of $Tb^{(+3)}$ is 1.04 Å which is quite close to the ionic radii of $Y^{(+3)}$ of 1.02 Å. Because Tb123 is normally processed as a non-superconducting phase, the substitution of Tb123 for Y123 into a bulk or thin film superconductor has the potential to create localized regions of size on the order of one unit cell or larger of either reduced $T_c$ regions or potential site defects. Such regions can provide the non-superconducting pinning centers with particle densities approaching $1.5-3 \times 10^{11}$ cm$^{-2}$ which are necessary to pin magnetic fields of ~3–6 T.

According to the method of the present invention, precursor materials (i.e. laser ablation targets in the case of pulsed laser deposition) were manufactured in-house by the following procedure: $Y_{0.9}Tb_{0.1}Ba_2Cu_3O_{7-z}$ powder was prepared from $Y_2O_3$, $BaCO_3$, CuO, and $Tb_4O_7$ powder (all nominally 99.99+% pure). The powders were dried, mixed, and then calcined at 850° C. and 880° C. This powder was then used to make two targets of compositions $Y_{0.9}Tb_{0.1}Ba_2Cu_3O_{7-z}$ and $Y_{0.99}Tb_{0.01}Ba_2Cu_3O_{7-z}$ with the second composition consisting of 10 mol % $Y_{0.9}Tb_{0.1}Ba_2Cu_3O_{7-z}$ and 90 mol % Y123 powder. The targets were then fully reacted at 940° C. and 920° C. respectively for 50 hours. The $Y_{0.9}Tb_{0.1}Ba_2Cu_3O_{7-z}$ target was found to be 84.8% dense and the $Y_{0.99}Tb_{0.01}Ba_2Cu_3O_{7-z}$ target was found to be 88.7% dense. The estimated purity of the targets was 99.99+% pure.

Next, multiple compositions of (Y,Tb) 123 films were deposited by pulsed laser deposition, using parameters and conditions optimized previously for Y123. The depositions were performed on strontium titanate (STO and lanthanum aluminate (LAO) substrates with the overall time for film growth being about 20 minutes. Depositions were performed using a Lambda Physik, LFX 300 KrF excimer laser ($\lambda$=248 nm). The laser pulse rate was 4 Hz and the laser fluence was ~3.2 J/cm$^2$. The target-to-substrate distance was kept at 6 cm for all of the depositions. The oxygen pressure during the deposition was 300 mTorr for both of the Y,Tb-123 targets, as measured with capacitance manometer and convectron gauges within <10% variation. Oxygen gas (>99.997% purity) flowed into the chamber during growth and the oxygen pressure in the chamber was kept constant using a downstream throttle-valve control on the pumping line. The laser beam was scanned across the targets to improve thickness uniformity of the film. The LaAlO$_3$ (100) and SrTiO$_3$ (100) single crystal substrates were ultrasonically cleaned for 2 minutes, using first acetone followed by isopropyl alcohol. Crystalline substrates were provided by the manufacturer epitaxially polished on both sides of the LaAlO$_3$ and on one side for SrTiO$_3$, and were attached to the heater using a thin layer of colloidal Ag paint. LAO and STO substrate sizes were ~3.2×3.2 mm$^2$ for magnetic Jc measurements.

The background pressure in the chamber was reduced to <1.4×10$^{-4}$ torr prior to deposition. Samples were heated from room temperature to the deposition temperature of 775° C. at ~1270° C./h. After deposition, the vacuum pumps and O$_2$ pressure control were shut off and the films were cooled radiantly from 775 ° C. to 500° C. while increasing the O$_2$ pressure to 1 atm. The temperature was then held at 500° C. for 30 minutes. The films were then cooled to room temperature. The (Y,Tb) 123 layer thickness was estimated by comparing previous deposition runs in the chamber using the same deposition parameters.

Magnetic $J_c$ measurements were made with a Quantum Design Model 6000 Physical Property Measurement System (PPMS) with a vibrating sample magnetometer (VSM) attachment in fields of 0 to 9 T, and a ramp rate 0.01 T/s. The $J_c$ of the square samples was estimated using a simplified Bean model with $J_c=30$ $\Delta M/da^3$ where $\Delta M$ is in emu, film thickness d and lateral dimension a are in cm and J is in A/cm$^2$. Samples were subsequently acid-etched at the corners of the samples for thickness measurements. A P-15 Tencor profilometer was used to measure the thickness of the (Y,Tb) 123 films. Care was used to measure in twin-free areas of the LaAlO$_3$ substrates, which were observed visually at high magnification. The film thickness and dimensions of each sample were measured multiple times to reduce errors in determination of the superconducting volume and a to <5%.

Figure 2:
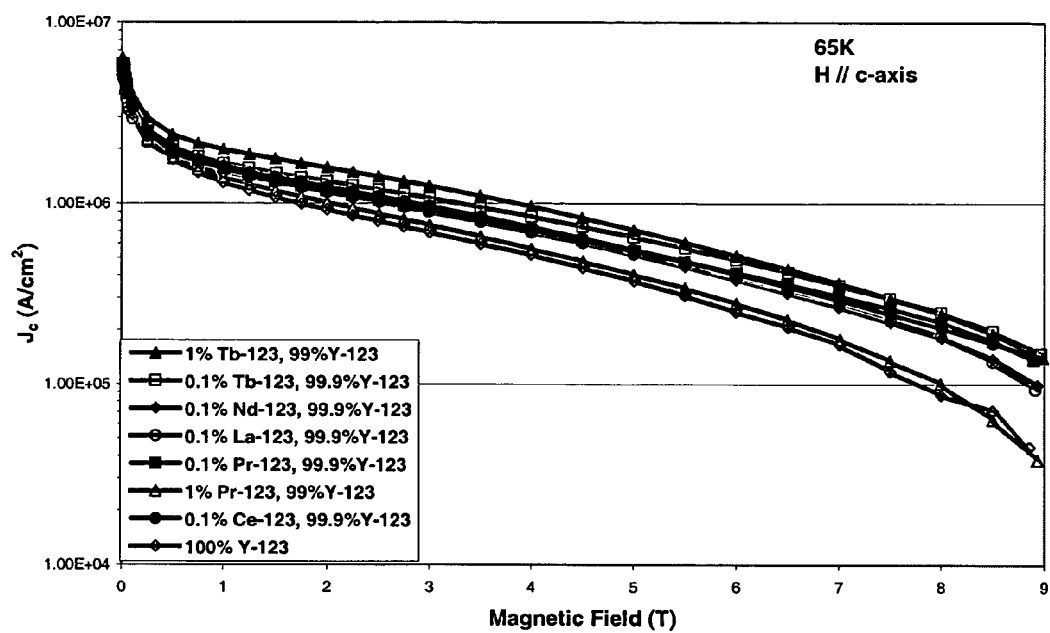

The results of $J_c$ measurements that were performed on several samples made using this invention are shown in FIGS. 1 and 2. FIG. 1 shows the magnetic $J_c$ values of the $Y_{1-x}M_xBa_2Cu_3O_{7-z}$ films at 77 K compared to a reference 123 film made using the same deposition conditions. At elevated field, the $J_c$ values of the samples made using this invention exceeded the standard Y123 values by more than 2000% (6T, 77K, H//c-axis, M=Tb, x=0.01). FIG. 2 shows the magnetic $J_c$ values of the $Y_{1-x}M_xBa_2Cu_3O_{7-z}$ films at 65 K compared to a reference 123 film made using the same deposition conditions. At elevated field, the $J_c$ values of the samples made using this invention exceeded the standard Y123 values by more than 200% (8.9T, 77K, H//c-axis, M=Tb, x=0.01).

Thus, the minute doping method of the present invention has been demonstrated to provide enhanced flux pinning within HTS materials. Additionally, while the invention has been described in terms of pulsed laser deposition techniques, it is not considered so limited. The minute doping approach of the present invention can be used in all HTS deposition methods such as MOCVD, MOD, PLD, sol-gel, sputtering electrolytic deposition, etc., since it is not process dependent.

The foregoing description of the illustrated embodiment has been presented for purposes of illustration and description. It is not intended to be exhaustive or to limit the invention to the precise form disclosed. Obvious modifications or variations are possible in light of the above teachings. The embodiment described was chosen to provide an illustration of the principles of the invention and its practical application to thereby enable one of ordinary skill in the art to utilize the invention in various embodiments and with various modifications as are suited to the particular scope of the invention as determined by the appended claims when interpreted in accordance with the breadth to which they are fairly, legally and equitably entitled.

The invention claimed is:

1. A method for enhancing the flux pinning of a YBCO superconductor comprising the steps of:
   preparing a quantity of precursor YBCO material;
   doping said YBCO material with a deleterious element to produce $Y_{1-x}M_xBa_2Cu_3O_{7-z}$, wherein x is less than or equal to about 0.01; and
   depositing said $Y_{1-x}M_xBa_2Cu_3O_{7-z}$, from said doping step above onto a substrate, wherein current densities of said YBCO superconductor exceed those of said precursor YBCO material by up to 2000% at 77K.

2. A method for enhancing the flux pinning of a YBCO superconductor comprising the steps of:
  preparing a quantity of precursor YBCO material;
  doping said YBCO material with a deleterious element to produce $Y_{1-x}M_xBa_2Cu_3O_{7-z}$, wherein x is less than or equal to about 0.01.; and
  depositing said $Y_{1-x}M_xBa_2Cu_3O_{7-z}$, from said doping step above onto a substrate, wherein current densities of said YBCO superconductor exceed those of said precursor YBCO material by up to 200% at 65K.

3. A method for enhancing the flux pinning of a YBCO superconductor comprising the steps of:
  preparing a quantity of precursor YBCO material;
  doping said YBCO material with a rare earth element to produce $Y_{1-x}M_xBa_2Cu_3O_{7-z}$ wherein x is less than or equal to about 0.01; and
  depositing said $Y_{1-x}M_xBa_2Cu_3O_{7-z}$ from said doping step above onto a substrate, wherein current densities of said YBCO superconductor exceed those of said precursor YBCO material by up to 2000% at 77K.

4. A method for enhancing the flux pinning of a YBCO superconductor comprising the steps of:
  preparing a quantity of precursor YBCO material;
  doping said YBCO material with a rare earth element to produce $Y_{1-x}M_xBa_2Cu_3O_{7-z}$ wherein x is less than or equal to about 0.01; and
  depositing said $Y_{1-x}M_xBa_2Cu_3O_{7-z}$ from said doping step above onto a substrate, wherein current densities of said YBCO superconductor exceed those of said precursor YBCO material by up to 200% at 65K.

5. A method for enhancing the flux pinning of a YBCO superconductor comprising the steps of:
  preparing a quantity of precursor YBCO material;
  doping said YBCO material with a rare earth element to produce $Y_{1-x}M_xBa_2Cu_3O_{7-z}$ wherein x is less than or equal to about 0.01; and
  depositing, by pulsed laser deposition, said $Y_{1-x}M_xBa_2Cu_3O_{7-z}$ from said doping step above onto a substrate, wherein current densities of said YBCO superconductor exceed those of said precursor YBCO material by up to 2000% at 77K.

6. A method for enhancing the flux pinning of a YBCO superconductor comprising the steps of:
  preparing a quantity of precursor YBCO material;
  doping said YBCO material with a rare earth clement to produce $Y_{1-x}M_xBa_2Cu_3O_{7-z}$ wherein x is less than or equal to about 0.01; and
  depositing, by pulsed laser deposition, said $Y_{1-x}M_xBa_2Cu_3O_{7-z}$ from said doping step above onto a substrate, wherein current densities of said YBCO superconductor exceed those of said precursor YBCO material by up to 200% at 65K.

7. A method for enhancing the flux pinning of a YBCO superconductor comprising the steps of:
  preparing a quantity of precursor YBCO material;
  doping said YBCO material with a deleterious element to produce $Y_{1-x}M_xBa_2Cu_3O_{7-z}$ wherein x is less than or equal to about 0.01; and
  depositing, by pulsed laser deposition, said $Y_{1-x}M_xBa_2Cu_3O_{7-z}$ from said doping step above onto a substrate, wherein current densities of said YBCO superconductor exceed those of said precursor YBCO material by up to 2000% at 77K.

8. A method for enhancing the flux pinning of a YBCO superconductor comprising the steps of:
  preparing a quantity of precursor YBCO material;
  doping said YBCO material with a deleterious element to produce $Y_{1-x}M_xBa_2Cu_3O_{7-x}$ wherein x is less than or equal to about 0.01; and
  depositing, by pulsed laser deposition, said $Y_{1-x}M_xBa_2Cu_3O_{7-z}$ from said doping step above onto a substrate, wherein current densities of said YBCO superconductor exceed those of said precursor YBCO material by up to 200% at 65K.

9. The method of claim 1 wherein said depositing step is performed using a high temperature superconducting deposition method from the group of metal-organic chemical vapor deposition, metal-organic deposition, pulsed laser deposition, sol-gel and sputtering and/or electrolytic deposition.

10. The method of claim 3 wherein said rare earth element is from the group of La, Ce, Pr, Nd, Pm, Sm, Eu, Gd, Tb, Dy, Ho, Er, Tm, Yb and Lu.

11. The method of claim 3 wherein said depositing step is performed using a high temperature superconducting deposition method from the group of metal-organic chemical vapor deposition, metal-organic deposition, pulsed laser deposition, sol-gel and sputtering and/or electrolytic deposition.

12. The method of claim 5 wherein said rare earth element is from the group of La, Ce, Pr, Nd, Pm, Sm, Eu, Gd, Tb, Dy, Ho, Er, Tm, Yb and Lu.

* * * * *